United States Patent [19]
Mück et al.

[11] Patent Number: 5,065,096
[45] Date of Patent: Nov. 12, 1991

[54] SUPERCONDUCTOR JOSEPHSON JUNCTION STRIP RESONATOR SENSOR FOR MEASURING MAGNETIC FLUX

[75] Inventors: Hans-Michael Mück, Ehringshausen; Christoph Heiden, Jülich, both of Fed. Rep. of Germany

[73] Assignee: Forschungszentrum Julich GmbH, Julich, Fed. Rep. of Germany

[21] Appl. No.: 503,618

[22] Filed: Apr. 2, 1990

[30] Foreign Application Priority Data

Sep. 21, 1989 [DE] Fed. Rep. of Germany ....... 3931441

[51] Int. Cl.$^5$ ............. G01R 33/0g222335; H01P 7/00
[52] U.S. Cl. .................................. 324/248; 333/99 S; 333/219; 505/702; 505/846
[58] Field of Search .......... 324/248; 307/306; 333/219, 219.2, 222, 99 S; 357/5, 27; 505/702, 846; 29/599

[56] References Cited

U.S. PATENT DOCUMENTS 4,344,052  8/1982  Davidson ........................... 357/5 X

OTHER PUBLICATIONS

IBM Journal of Research and Development, vol. 33, No. 3, May 1989–Index Page and Article by C. E. Gough "Granular Josephson And Quantum Interference " (p. 262 ff.).
Chemical Engineering News, 27 Nov. 1989, p. 9 ff., Article "High-Temperature Superconductors on the Road to Applications" by Ann M. Thayer.
Scientific American, Feb. 1989, p. 61 ff., "The New Superconductors: Prospects for Applications " by Alan M. Wolsky et al.
Odehnal et al.; "A Radio-Frequency . . . , SQUID", *Ceskoslovensky Casopis Pro Fysiku Sekce A*, vol. 24, No. 4, pp. 356–363, 1974.
Clark et al.; Low Noise, Permanently Adjusted UHF SQUID Magnetometer *IEEE Transactions on Magnetics*, vol. MAG-11, No.2, Mar. 1975 pp. 736–738.
Viktorin et al.; Superconductive Quantum Magnetometer of the SQUID-type, *Elektrotechnicky Casopis*, vol. 27, No. 4, pp. 309–321, 1976.

Primary Examiner—Gerard R. Strecker
Attorney, Agent, or Firm—Herbert Dubno

[57] ABSTRACT

A sensor for measuring magnetic flux has at least one hole or opening in a strip resonator of superconductive material defining a ring in which a Josephson element is integrated into the strip resonator and coupled thereto so that attenuation in the tank circuit formed by the ring when a standing wave is established in the strip resonator can be picked up capacitively by a further strip conductor.

10 Claims, 6 Drawing Sheets

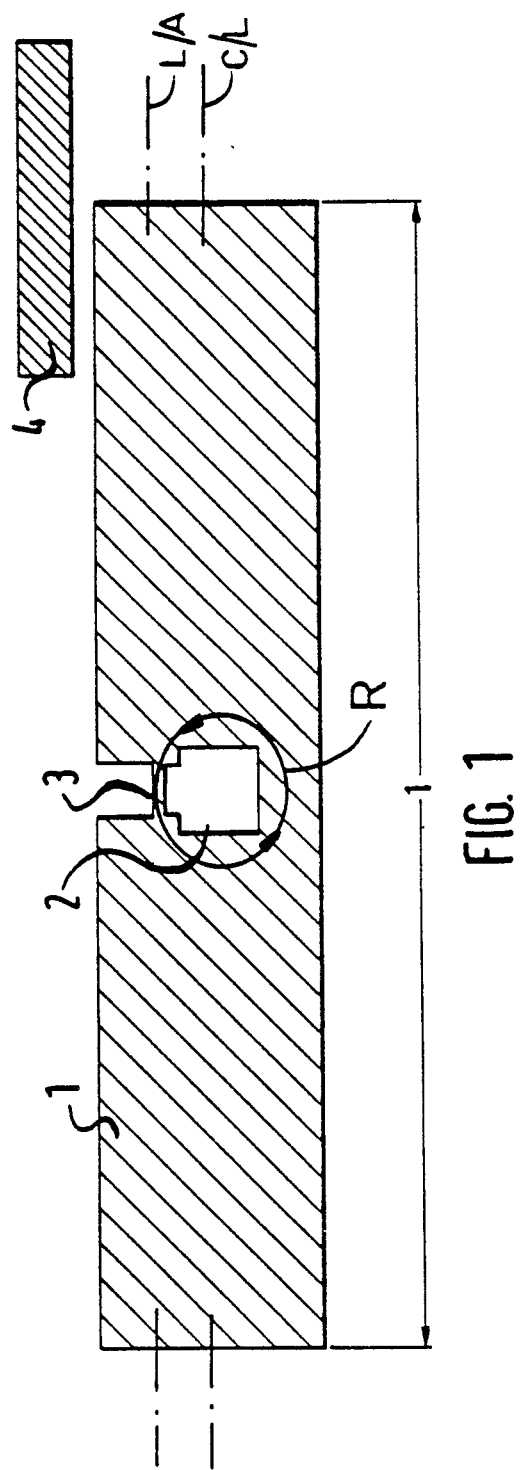

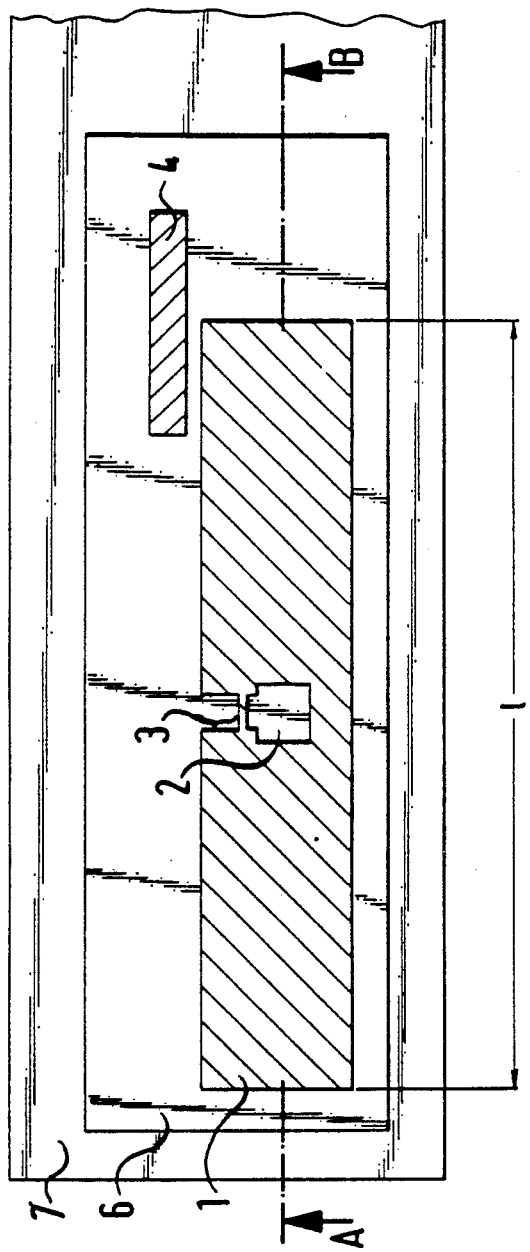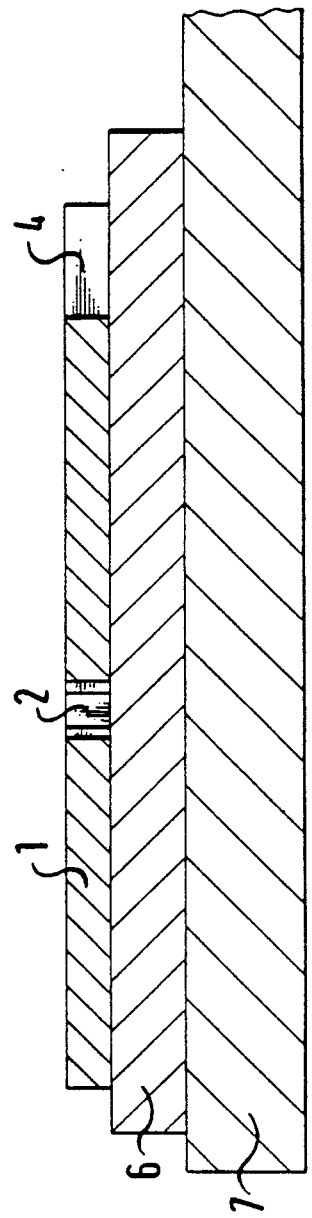

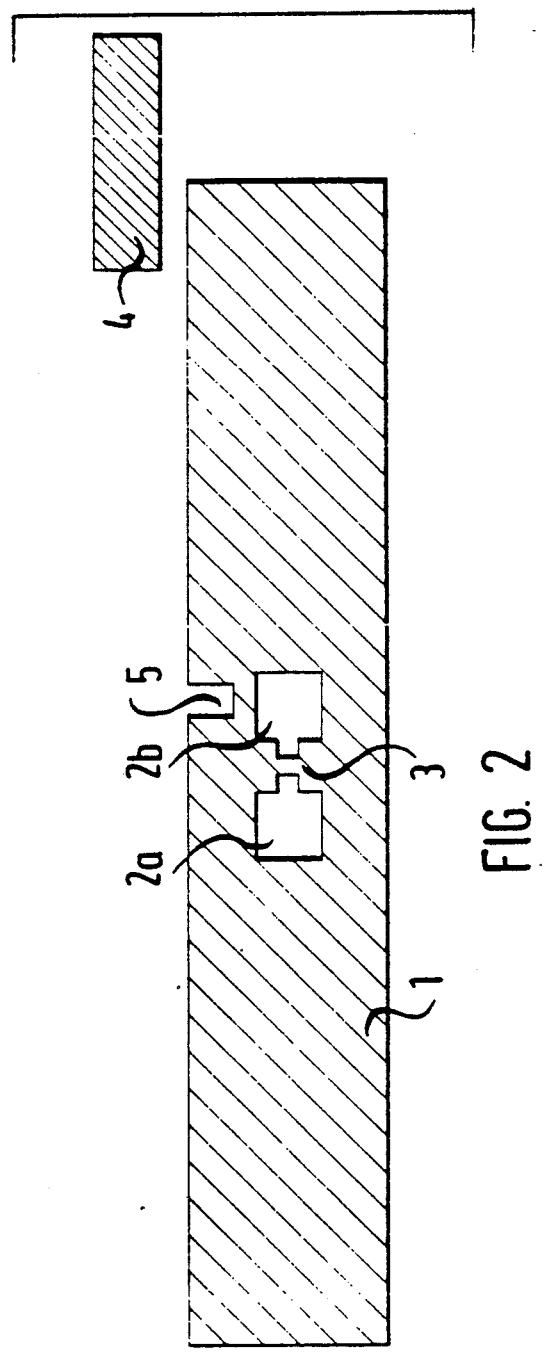

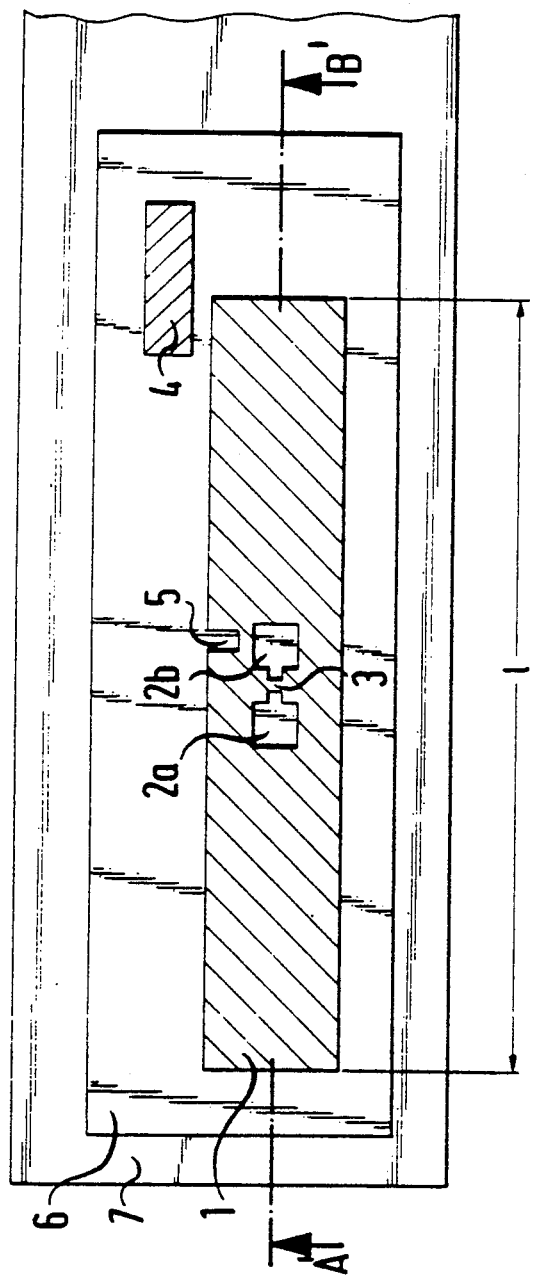
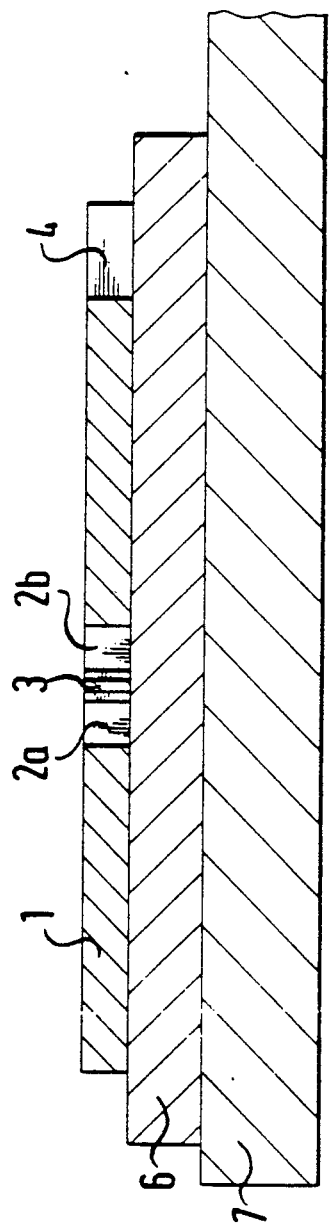

SUPERCONDUCTOR JOSEPHSON JUNCTION STRIP RESONATOR SENSOR FOR MEASURING MAGNETIC FLUX

FIELD OF THE INVENTION

My present invention relates to a sensor for the measurement of magnetic flux and, more particularly to a sensor for such measurements using the principles of superconductive Josephson junctions, referred to hereinafter as Josephson elements. More specifically the invention relates to a sensor for the measurement of magnetic flux which utilizes a superconductive ring having a Josephson junction incorporated therein and coupled to an electric oscillatory circuit which may be formed by the ring or which can be formed in part by the ring. This circuit may also be referred to as a tank circuit.

BACKGROUND OF THE INVENTION

This invention utilizes principles of Josephson junctions and reference may be had in this regard to the article by C. E. Gough entitled *Granular Josephson and quantum interference effects in HTC ceramic superconductors*, IBM Journal of Research and Development, Vol. 33, No. 3, pp. 262 ff, May 1989; the article entitled *High-Temperature Superconductors on the Road to Applications*, Nov. 27, 1989, Chemical and Engineering News, pages 9 ff; the article by Alan M. Wolsky et al entitled *The New Superconductors: Prospects for Applications*, Scientific American, February 1989, pages 61 ff.

In sensors for the measurement of magnetic flux comprising a superconductive ring having at least one Josephson element incorporated therein (see p. 263 of the aforementioned IBM Journal article) and coupled to an electrical oscillatory circuit, i.e. a tank circuit, the superconductive ring having the Josephson element or junction incorporated therein, is fabricated by thin film technology whereby both the ring and the Josephson element may be formed as a thin layer on a substrate by evaporative deposition or cathodic sputtering.

In operation of such sensors, they are generally coupled in an electrical parallel oscillating or resonant circuit, generally referred to as a tank circuit hereinafter, which likewise can be superconductive and can have a resonant frequency which will be designated as f hereinafter.

Impressed upon this circuit is a high-frequency current with the identical frequency f. The superconductive ring acts as a damper for the oscillations of the tank circuit such that the degree of damping is a function of the magnetic flux through the superconductive ring. As a consequence, there is also a change in the voltage drop across the tank circuit which can be read out by appropriate evaluating or detecting electronic circuitry. The circuitry need be responsive, therefore, only to this voltage drop.

It is also known that the intrinsic or characteristic noise of such sensors and, consequently, their maximum sensitivity, can be increased when the operating frequency of the tank circuit is increased.

At the higher frequencies (f>500 MHz) it is difficult to realize such tank circuits from discrete elements like coils and condensers. Furthermore the coupling between the tank circuit and the superconductive ring drops because of the fact that the inductivity of the tank circuit becomes significantly less with increasing frequency, eventually reaching a minimum level at which coupling fails as a practical matter altogether.

OBJECTS OF THE INVENTION

It is, therefore, the principal object of the present invention to provide a sensor for the measurement of magnetic flux and especially a sensor of the type described which comprises a superconductive ring having a Josephson element incorporated therein and coupled to an electrical oscillatory circuit, which can effectively be operated at higher frequencies than hitherto known sensors of this type, but also with good coupling between the tank circuit and the superconductive ring containing the Josephson element.

Another object of this invention is to provide a sensor for the measurement of a magnetic flux traversing a superconductive ring having a Josephson element incorporated therein, whereby drawbacks of earlier systems are obviated.

SUMMARY OF THE INVENTION

These objects and others which will become apparent hereinafter are attained, in accordance with the invention, in a sensor for the measurement of magnetic flux and comprising a superconductive ring having a Josephson element or a plurality of Josephson junctions forming a Josephson element incorporated therein and which is coupled to an electric oscillatory or tank circuit.

According to the invention the electric oscillatory circuit comprises a piece of a strip conductor forming a resonator or standing electrical waves on an appropriate substrate and which is formed with an opening traversed by the magnetic flux to be measured, the opening being bounded by at least one Josephson element so that the resulting superconductive ring (formed around this opening and including the Josephson element) is integrated in the strip resonator formed by that conductor. The Josephson element is oriented so that it extends along an axis of the strip resonator, namely, its center line or middle axis or a longitudinal axis thereof and the coupling of the strip resonator to the evaluating electronic circuitry, i.e. the oscillation damping or voltage drop detector is capacitive and is effected through a further piece of a strip conductor lying on and along the strip resonator.

According to the invention, therefore, the sensor has its superconductive ring and tank circuit formed as a single structural unit and constituted by the strip resonator so that the strip resonator itself forms a tank circuit and its boundary around the opening constitutes the superconductive ring in which the Josephson element is incorporated. The superconductive ring as a functional part of the sensor thus is formed more or less first during the operation of the sensor.

Since the Josephson element lies along the center line or a longitudinal axis of the strip resonator, a sufficiently high frequency current can be fed thereto to ensure that there will flow in the Josephson junction the requisite current for the measurement of the magnetic flux.

For operation of the sensor, of course, it is necessary to supply the strip resonator with a resonant frequency which can generate standing waves in the strip resonator. For a given length of the strip resonator, this can be easily done by adjusting the applied resonant frequency until standing waves develop in the strip resonator, utilizing, for example, a variable frequency source.

However, it is also possible to operate with a fixed frequency source and to adjust the length of the strip resonator so that its electrical length l will correspond to an odd number multiple of the half wavelength of the operating frequency.

To incorporate the Josephson junction in the superconductive ring so it will be maximally effective, it is positioned in the strip resonator at a location of maximum current flow in the strip resonator.

It has been found to be desirable, for good coupling of the strip resonator to the electronic circuitry for detecting damping and hence outputting the measurement of magnetic flux and which operates at room temperature, hereinafter referred to as the room temperature electronic circuitry, to utilize for this coupling the further piece of strip conductor and to locate it in a region of the strip resonator at which a voltage antinode is formed.

The number of pieces of the strip conductor serving for coupling purposes can be applied to the strip resonator at a multiplicity of such voltage antinodes.

The sensor of the invention, by comparison with earlier sensors utilizing a ring and a Josephson junction or element incorporated therein, has higher sensitivity to measurements of change in the magnetic flux. As a rule, the measurement is not a measurement of absolute values of magnetic flux.

Usually sensors of this type are useful only for determining changes in the magnetic flux by moving the sensor along a body or system along which the magnetic field varies or by leaving the sensor in place in a case where magnetic variability results from the magnetic field source. In the measurement range, therefore, a homogeneous magnetic field can be detected by a lack of relative change of the magnetic flux by the measurement.

When a nonhomogeneous magnetic flux is to be detected, i.e. evaluated by measuring it, and it is desirable to eliminate the effect of a superimposed homogeneous magnetic flux, for example, in the region of a source of flux disturbance, we can use a version of the sensor of the invention in which along the center line or longitudinal axis of the strip resonator there are formed a plurality of openings or holes in succession and between which the Josephson element or elements can be provided The strip resonator in the region of the opening as well as with respect to the opening and with respect to its center line or longitudinal axis should then be formed asymmetrically.

The asymmetry of the strip resonator in the region of the openings serves to generate a high frequency current in the Josephson element. The asymmetry can be realized by providing the strip resonator at one of the openings with a lateral cutout or recess so that a constriction is formed at this location. The current flow in this constriction of the strip resonator, therefore, is different from the current flow at the corresponding location in the vicinity of the other opening, i.e. the current distribution along the two openings differs This ensures a resultant current through the Josephson junction.

It is also possible to detect or to measure an inhomogeneous magnetic flux in the region of both openings or a differently changing magnetic flux in this measuring range with reference to the two openings, for example, in the case of changing brain currents.

According to this aspect of the invention, further, the openings can be arranged symmetrically of the center line or longitudinal axis of the strip. As mentioned above, moreover, the length l of the strip resonator can be an odd number multiple of the half wavelength of the operating frequency, the Josephson element can be disposed at a maximum current flow location of the strip resonator and the strip conductor for capacitive coupling of the strip resonator can be disposed in a region of a voltage antinode of the standing wave.

According to a further feature of the invention, if the Josephson element is formed as a microbridge, the heat generated in the microbridge by dissipation cannot completely be removed from it, when the period or duration of the operating frequency of the sensor is small by comparison with the time over which the heat arising in the microbridge is carried away by thermal conductivity. This leads to an elevated temperature of the microbridge and in turn to a reduction of its critical current, which can improve the operation of the sensor. This improvement can be even more effective, if the part of the substrate beneath the microbridge is constituted of a material having the smallest possible thermal conductivity, i.e. a low thermal conductivity and a thermal conductivity that is lower than that of the strip conductor and that of the substrate.

More particularly, a sensor of the invention can comprise:

a substrate;

a first strip superconductor having a longitudinal axis and forming a strip resonator for standing electrical waves at an operating frequency f, the strip resonator being formed with an opening and being traversable by the magnetic flux and bounded by a superconductive ring of the first strip superconductor having a Josephson element incorporated therein and at a boundary of the opening so that the ring is integrated in the strip resonator, the Josephson element lying along the axis of strip resonator;

means connectable to the strip resonator for applying the operating frequency f thereto;

at least one further strip conductor lying on the strip resonator and capacitively coupled thereto; and electrical circuitry connected to the further strip conductor and responsive to oscillatory damping of the strip resonator by magnetic flux traversing the strip resonator for outputting a measurement of the magnetic flux.

BRIEF DESCRIPTION OF THE DRAWING

The above and other objects, features and advantages of the present invention will become more readily apparent from the following description, reference being made to the accompanying drawing in which:

FIG. 1 is a plan view illustrating principles of the invention;

FIG. 1a is a diagram of the measuring device of the invention in an embodiment in which the device has one opening;

FIG. 1b is a cross sectional view taken along the line A-B of FIG. 1a;

FIG. 2 is a plan view further illustrating principles of the invention;

FIG. 2a is a view similar to FIG. 1a illustrating an embodiment in which two holes or openings are provided;

FIG. 2b is a cross sectional view taken along the line A'-B' of FIG. 2a;

SPECIFIC DESCRIPTION

The illustration of FIG. 1 is intended to show a principle of the invention. A strip conductor 1 is here provided with a length l which is so selected that it is an odd number multiple of an impressed operating frequency so that an electrical standing wave is generated in the strip 1 which is a superconductor and is held at a temperature below its critical temperature $T_c$ for measurement purposes.

The result is a standing electrical wave in this strip conductor.

The strip conductor is provided with a hole or opening 2 so that the region surrounding this opening defines a ring which is likewise superconductive and is integrated into the strip conductor 1. Along this ring and hence along the boundary of the opening 2 is a Josephson element which is represented at 3. The strip conductor 1 has a center line C/L and a longitudinal axis L/A and the Josephson element 3 here lies along this longitudinal axis or center line or is parallel thereto so that it will always lie along an axis extending in the longitudinal direction.

The ring and the Josephson junction, therefore, form a tank circuit in which an oscillation is generated, with the oscillation current being represented by the ring arrow R in FIG. 1.

Figure 4:
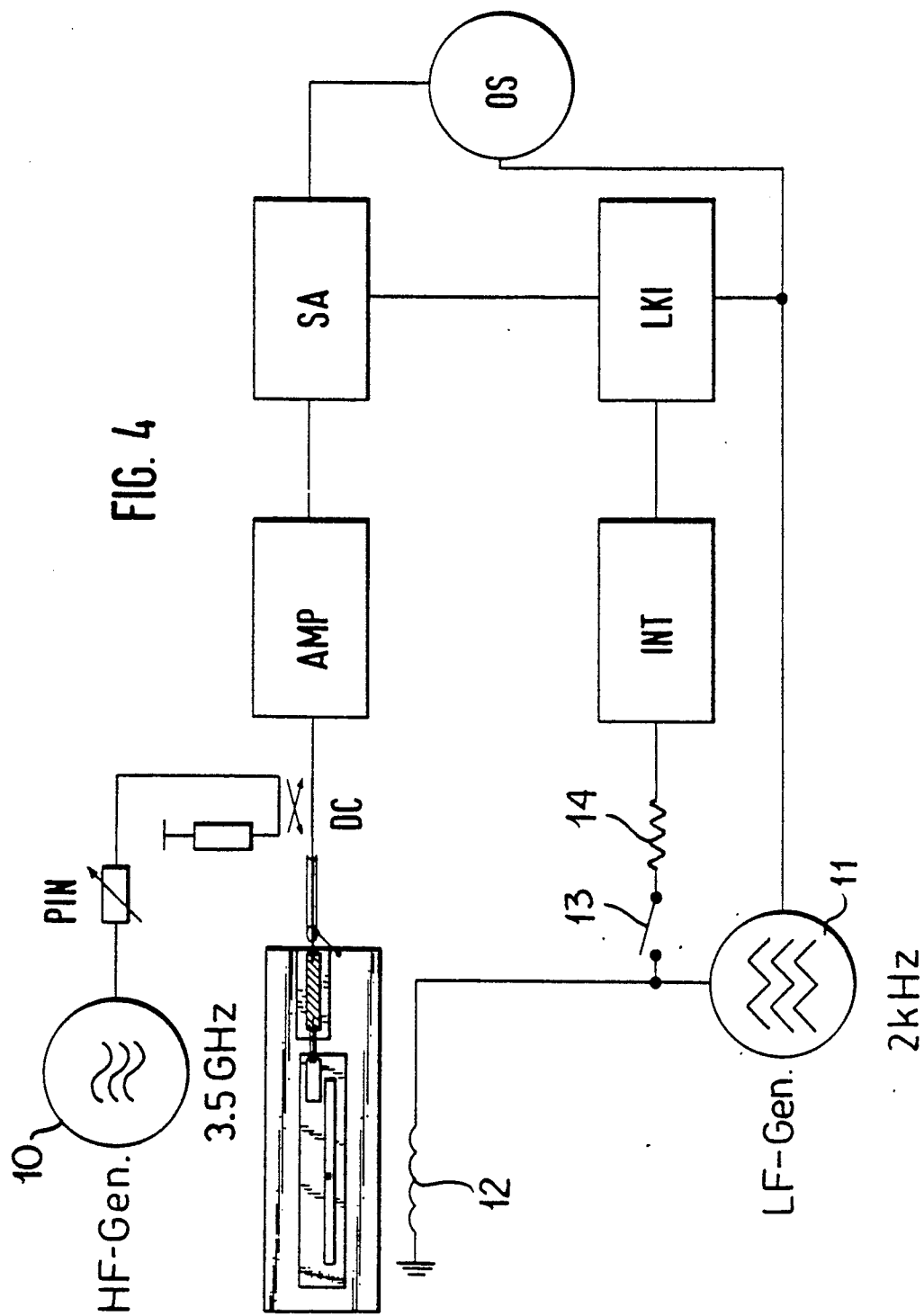
FIG. 4 is a block circuit diagram illustrating the sensor of FIG. 3 and the circuitry associated therewith.

A magnetic flux through the hole 2 or even adjacent the sensor will cause damping of the oscillation as described above and this effect, coupled to the standing wave, can be capacitively detected in another strip conductor 4 which is capacitively coupled to the strip conductor 1 and from which the damping effect can be detected by the circuitry shown in FIG. 4.

FIGS. 1a and 1b show an embodiment of this system in which a single opening is provided. FIGS. 2, 2a and 2b illustrate an embodiment in which two openings are provided in succession in the longitudinal direction along the strip resonator.

Figure 3:
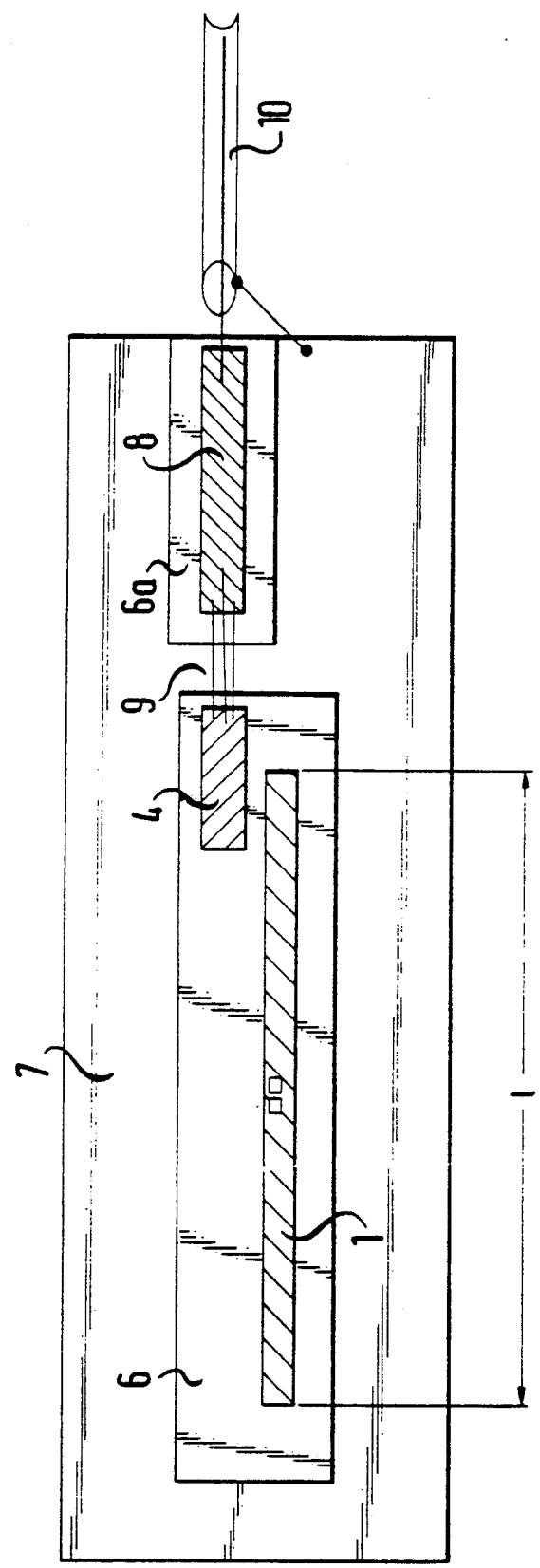
FIG. 3 is a diagram illustrating the mechanical mounting of the sensors with its electrical contact arrangement.

FIG. 3 illustrates how electrical connection may be made to the sensors of FIGS. 1a, 1b and 2a, 2b, while FIG. 4 illustrates how the room temperature electrical circuitry is connected, utilizing the contact system of FIG. 3 of the superconductor sensors.

Turning, therefore, to FIGS. 1a and 1b, it can be seen that FIG. 1a shows a relatively simple version of the sensor comprised of the strip resonator 1, the opening 2 integrated therein and surrounded by the superconducting ring as described above. The superconducting ring is not structurally distinguished by anything else other than being a boundary of the opening since it is first formed by the ring current illustrated in FIG. 1 when the device is placed in operation.

This ring current flows through the Josephson element 3 which is oriented parallel to the middle axis of the strip resonator 1 and it is important that the width of the strip resonator on the side of the opening opposite the Josephson element be greater than the width of the Josephson element.

A further strip or strips 4 disposed parallel to the strip resonator 1 serves for capacitive coupling of the strip resonator to the electronic circuitry shown in FIG.4. Strip resonator 1 and the further strip 4 can be supported on a substrate 6 and the latter can be mounted on a substrate holder 7.

The length l of the strip resonator is so dimensioned that it corresponds to an odd multiple of the half wavelength of the operating frequency f. The Josephson element is located at a region of maximum current flow in the strip resonator 1.

FIG. 1b shows the sensor of FIG. 1 in longitudinal section.

In this FIGURE the substrate holder 7 is shown in greater detail and can be both highly electrically and highly thermally conductive, i.e. composed of a material like copper. The substrate 6 is a material of the smallest possible dielectric loss type and can be composed, for example, of $Al_2O_3$ (1 mm thick). The strip resonator 1 is composed of a superconductive material, for example Nb 100 nm (nanometer, $10^{-9}$ m) in thickness and is formed with the opening 2. Note that other superconductors such as the high-temperature superconductors described in the aforementioned publications can be employed and the device is intended to operate at superconducting temperatures, for example cryogenic temperatures, below the critical temperature $T_c$ of the niobium or other superconductor.

The version of the sensor illustrated in FIG. 2 also makes use of a strip resonator 1 in which, however, two openings 2a and 2b are provided with the Josephson element 3 disposed between these openings. The other strip conductor 4 providing the capacitive pickup, has also been illustrated.

In the region of the opening 2b, the strip resonator 1 is formed with a cutout or recess 5 so that the strip resonator is asymmetrical not only with respect to the openings themselves but also with respect to the middle and longitudinal axis. As has been developed above, this version of the sensor is particularly effective for the measurement of nonhomogeneous magnetic fluxes.

FIG. 3 illustrates the mechanical support and the electrical connection to the sensor.

On the substrate holder 7, a further substrate 6a is provided and carries a further piece 8 of a strip conductor (50 ohms) which is cemented to the substrate 6a. The strip conductor piece 4 is electrically connected with the strip conductor 8 by short aluminum wires 9 and the sheath of a coaxial cable 10 is soldered to the holder 7 while the core wire of the coaxial cable is soldered to the strip conductor 8. The cable 10 runs to the electronic evaluation circuitry.

FIG. 4 illustrates this circuitry in the context of the invention.

For the operation of the sensor of the invention, a high frequency current is generated, e.g. at a frequency of 3.5 GHz. For this purpose a high frequency generator 10 is provided. Its amplitude is controlled by a variable attenuator PIN to set the optimum level for the respective sensor.

This current is superimposed upon the strip resonator via a directional coupler DC. The voltage across the resonator is initially amplified in a preamplifier AMP and subjected to amplitude demodulation in a spectrum analyzer SA.

The resulting low frequency voltage which contains the information as to changes in the magnetic flux traversing the sensor can be displayed on an oscilloscope.

The sensor is preferably operated in a flux-locked loop system and for that purpose a low frequency generator 11 having an output of approximately 2 kHz is connected to a coil 12 disposed in the region of the sensor to provide a magnetic alternating flux feedback with a frequency of 2 kHZ.

Via the lock in amplifier LKI and integrator INT, the magnetic flux superimposed on the sensor can be maintained constant. A switch 13 in series with a resister 14 can cut in the flux-locked loop circuitry.

For a sensor of the type shown in FIG. 1, the following parameters can be used:

The substrate 6 can consist of sapphire with dimensions of $25 \times 5 \times 1$ mm$^3$ (width $\times$ length $\times$ thickness). The niobium film is applied in a thickness of 100 nm (nanometers, $10^{-9}$ m) by cathodic sputtering, utilizing a mask or the like to structure its film and form the opening 2 therein. The strip conductor resonator 1 can have a length of 20 mm and a width of 1 mm. The opening 2 of the sensor has dimensions of $40 \times 40$ micrometers. The Josephson element 3 is formed as a microbridge with a width of 150 nanometers ($10^{-9}$ m) and a length of 3 micrometers. The substrate holder 7 was a copper block. The applied high frequency current had a frequency of 3.5 GHz with a power of $-40$ dBm. The flux-dependent voltage change detected by the tank circuit can amount to several hundred microvolts peak-to-peak. The measurements were carried out at a temperature of the sensor of 4.2 k.

Similar parameters can be used with the sensor of FIGS. 2a and 2b.

I claim:

1. A sensor for measuring a magnetic flux, comprising:
    a substrate;
    a first strip superconductor having a longitudinal axis and forming a strip resonator for standing electrical waves at an operating frequency f, said strip resonator being formed with an opening and being traversable by said magnetic flux, said opening being bounded by a superconductive ring of said first strip superconductor having a Josephson element incorporated therein and at a boundary of said opening so that said ring is integrated in said strip resonator, said Josephson element lying along said axis of strip resonator;
    means coupled to said strip resonator for applying said operating frequency f thereto;
    at least one further strip conductor lying on said strip resonator and capacitively coupled thereto; and
    electrical circuitry connected to said further strip conductor and responsive to oscillatory damping of said strip resonator by magnetic flux traversing said strip resonator for outputting a measurement of said magnetic flux.

2. The sensor defined in claim 1 wherein the electrical length of said strip resonator is an odd number multiple of a half wavelength of said frequency f.

3. The sensor defined in claim 1 wherein said Josephson element is disposed at a location of maximum current flow in said strip resonator.

4. The sensor defined in claim 1 wherein said further strip conductor is disposed at a standing wave voltage antinode of said strip resonator.

5. A sensor for measuring a magnetic flux, comprising:
    a substrate;
    a first strip superconductor having a longitudinal axis and forming a strip resonator for standing electrical waves at an operating frequency f, said strip resonator being formed with two equal sized openings formed in succession in said strip resonator along said axis and having a Josephson element provided therebetween so that said openings are bounded by superconductive rings integrated in said strip resonator with said Josephson element lying generally along said axis, said strip resonator in the region of said openings and with respect to said axis being formed asymmetrical;
    means coupled to said strip resonator for applying said operating frequency f thereto;
    at least one further strip conductor lying on said strip resonator and capacitively coupled thereto; and
    electrical circuitry connected to said further strip conductor and responsive to oscillatory damping of said strip resonator by magnetic flux traversing said strip resonator for outputting a measurement of said magnetic flux.

6. The sensor defined in claim 5 wherein said openings are arranged symmetrically with respect to said axis.

7. The sensor defined in claim 5 wherein said Josephson element is disposed at a location of maximum current flow in said strip resonator.

8. The sensor defined in claim 5 wherein said further strip conductor is arranged at a standing wave voltage antinode region of said strip resonator.

9. The sensor defined in claim 5 wherein said Josephson element is a microbridge and a portion of said substrate beneath said Josephson element is composed of a material having a low thermal conductivity.

10. The sensor defined in claim 1 wherein said Josephson element is a microbridge and a portion of said substrate beneath said Josephson element is composed of a material having a low thermal conductivity.

* * * * *